US008229688B2

(12) United States Patent
Clark

(10) Patent No.: US 8,229,688 B2
(45) Date of Patent: Jul. 24, 2012

(54) METHOD AND APPARATUS FOR DETECTION USING MAGNETIC GRADIENT TENSOR

(75) Inventor: David Alan Clark, Lexington, KY (US)

(73) Assignee: Commonwealth Scientific and Industrial Research Organisation, Campbell (AU)

( * ) Notice: Subject to any disclaimer, the term of this patent is extended or adjusted under 35 U.S.C. 154(b) by 287 days.

(21) Appl. No.: 12/452,117

(22) PCT Filed: Jun. 18, 2008

(86) PCT No.: PCT/AU2008/000873
§ 371 (c)(1),
(2), (4) Date: Apr. 8, 2010

(87) PCT Pub. No.: WO2008/154679
PCT Pub. Date: Dec. 24, 2008

(65) Prior Publication Data
US 2010/0211337 A1    Aug. 19, 2010

(30) Foreign Application Priority Data
Jun. 18, 2007   (AU) ................................. 2007903249

(51) Int. Cl.
*G01R 15/00* (2006.01)
(52) U.S. Cl. ........................................................ 702/57
(58) Field of Classification Search .................... 702/57, 702/182–185, 188
See application file for complete search history.

(56) References Cited

U.S. PATENT DOCUMENTS

| 5,777,477 | A | 7/1998 | Wynn | |
|---|---|---|---|---|
| 6,476,610 | B1 | 11/2002 | Wiegert et al. | |
| 6,539,327 | B1 | 3/2003 | Dassot et al. | |
| 6,841,994 | B1 | 1/2005 | Wiegert et al. | |
| 6,865,455 | B1 | 3/2005 | Wiegert et al. | |
| 7,038,458 | B1 | 5/2006 | Wiegert et al. | |
| 7,180,580 | B2 * | 2/2007 | Guruprasad | 356/5.09 |
| 7,342,399 | B1 | 3/2008 | Wiegert et al. | |
| 2005/0090987 | A1 * | 4/2005 | Amundsen et al. | 702/14 |

OTHER PUBLICATIONS

International Search Report for PCT/AU2008/000873, mailed Jul. 8, 2008.
Written Opinion of the International Searching Authority for PCT/AU2008/000873, mailed Jul. 8, 2008.

* cited by examiner

*Primary Examiner* — Edward Raymond
(74) *Attorney, Agent, or Firm* — Nixon & Vanderhye P.C.

(57) ABSTRACT

Locating and characterising a magnetised body involves moving a magnetic gradient tensor sensor relative to the magnetised body along a profile, or allowing the magnetised body to move along a profile past the sensor. Magnetic gradient tensor measurements are obtained at points along the profile. A rotational invariant calculated from the eigenvalues of the magnetic gradient tensor measurements is then used to locate and/or characterize the body. The rotational invariant can be the scaled moment of a point dipole representation of the magnetised body, or one third of the square root of the scaled moment. The rotational invariant is modelled and sufficient measurements obtained to over-determine parameters of the model. A system of linear equations resulting from a model of the gradient tensor elements is then solved using the determined values of parameters.

20 Claims, 9 Drawing Sheets

METHOD AND APPARATUS FOR DETECTION USING MAGNETIC GRADIENT TENSOR

CROSS-REFERENCE TO RELATED APPLICATIONS

This application is the U.S. national phase of International Application No. PCT/AU2008/000873 filed 18 Jun. 2008, which designated the U.S. and claims priority from Australian Provisional Patent Application No 2007903249 filed 18 Jun. 2007, the entire contents of each of which are incorporated herein by reference.

TECHNICAL FIELD

The present invention relates to detection of magnetic bodies, and in particular relates to defining the location and magnetic moment vector of a detected magnetic body by analysing the complete magnetic gradient tensor.

BACKGROUND OF THE INVENTION

Airborne, ground, marine and downhole magnetic measurements have played an important role in detection of magnetic targets such as land mines, naval mines, submarines, shipwrecks, unexploded ordnance (UXO), archaeological artefacts and structures, buried drums containing, for example, toxic waste, ferrous particles in food and hospital laundry, and many others. Magnetic surveys also have major applications to mapping geology, in exploration for minerals and energy resources, and in environmental and archaeological surveys. Total magnetic intensity (TMI) sensors may be used in such surveys. However, limiting factors when using TMI sensors include complicating effects of the orientation of the geomagnetic field, which produces asymmetric anomalies that are displaced from source locations, the sensitivity of the shape and strength of TMI anomalies to direction of source magnetisation, relatively low resolution compared to magnetic field gradients, frequent need for post-processing techniques, and the fact that only a limited, distorted and fuzzy view of geology or terrain is obtained due to cost constraints on sampling density. Moreover, it is not possible to locate targets uniquely between survey lines or to delineate adversely oriented structures in low latitudes near the Earth's equator.

Magnetic surveys using vector magnetometers such as fluxgate-based or SQUID-based detectors have also been considered, because of the extra information that is in principle obtainable from measuring three components of the field, rather than a single TMI component. Vector surveys, where the direct measurement of vector components has been attempted, have met with mixed success. The accuracy of direct measurement of the field vector is largely governed by orientation errors, which are generally so large that the theoretical derivation of the components from sufficiently densely sampled TMI is actually preferable. Vector magnetometry is so sensitive to orientation errors because the anomalies that need to be detected are usually very weak compared to the background geomagnetic field. For example a 1° change in orientation produces changes in vector components of the geomagnetic field of up to approximately 1000 nT, whereas anomalies are often of the order of a few nT, or even sub nanoTesla.

An important application of magnetic sensors is the detection, location and classification (DLC) of magnetic objects. Compact magnetic bodies can be well represented by a point dipole source, except very close to the body. A number of methods have been proposed for locating dipole targets from magnetic gradient tensor data. Some of these methods are based on point-by-point analysis of the eigenvectors of the tensor, and are adversely affected by noise in individual measurements of the gradient tensor elements. Calculated eigenvectors are inherently sensitive to noise in gradient tensor elements and eigenvector-based methods may not always be robust. If two eigenvalues are almost equal, for example, small perturbations of the eigenvalues can produce approximately 90° jumps in the corresponding eigenvector orientations. Methods that rely on recalculation of tensor elements with respect to principal axes of the tensor (which are defined by the eigenvectors) also suffer from this problem. Moreover, as the analysis is essentially point-by-point, the solutions are unreliable for individually noisy tensor measurements.

Furthermore, there is an inherent four-fold ambiguity in obtaining solutions for dipole location and orientation of its moment from point-by-point analysis of gradient tensors, which must be resolved by comparing solutions from different sensor locations, rejecting those that are not consistent (the so-called "ghost" solutions) and retaining the solutions that exhibit the best clustering. Existing methods of dipole tracking are also not robust to the contamination of the measured signal by variable background gradients, interfering anomalies, instrument drift or departures of the target from a pure dipole source.

Proposed methods for resolving ambiguity of gradient tensor measurements by eliminating ghost solutions rely on numerical differentiation of gradient tensor time-series to obtain gradient rate tensors, or by using arrays of triaxial magnetometers that constitute two or more tensor gradiometers with small spatial separation. Both approaches effectively amount to incorporating second order gradients of magnetic components into the analysis, which are more subject to noise than the first order gradient tensor. Furthermore, the incorporation of higher order gradient information greatly increases the mathematical complexity and computational demands of the solutions, making near real-time tracking difficult. Moreover, numerical differentiation amplifies noise in the original data, and the gradient rate tensor has a $1/r^5$ fall-off, which makes the signal very weak, except very close to the source.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY OF THE INVENTION

According to a first aspect the present invention provides a method of locating and characterising a magnetised body, the method comprising:

during relative movement between a magnetic gradient tensor sensor and the magnetised body, along a profile, obtaining a plurality of magnetic gradient tensor measurements corresponding to points along the profile, at different relative orientations between the sensor and magnetised body; and determining at least one characteristic of the magnetised body using a rotational invariant calculated from the eigenvalues of the magnetic gradient tensor measurements.

According to a second aspect the present invention provides a device for locating and characterising a magnetised body, the device comprising:

a sensor for obtaining a plurality of magnetic gradient tensor measurements at different relative orientations between the sensor and a magnetised body, during relative movement between the sensor and the magnetised body along a profile; and a processor for determining at least one characteristic of the magnetised body using a rotational invariant calculated from the eigenvalues of the magnetic gradient tensor measurements.

The present invention recognises that by measuring the magnetic gradient tensor rather than total magnetic intensity, it is possible to calculate from each such measurement a limited number of solutions for characteristics of the magnetised body. Such characteristics might be the range and direction of the magnetised body relative to the sensor and/or the magnitude and orientation of the magnetic moment of the magnetised body. Moreover, by obtaining measurements at each of multiple relative orientations between sensor and body, it is possible to eliminate spurious solutions and identify a single solution for range and direction information and for the dipole moment vector from such measurements. Thus, the present invention provides for analysis of a number of gradient tensor measurements along a profile to obtain a unique solution, which also averages out noise in the individual measurements, producing more robust and precise estimates of the target parameters. The present invention has the flexibility to use relatively few measurements or a large number, and to analyse a portion of the gradient tensor anomaly or the complete profile, depending on the signal-to-noise ratio, the desired precision and computational demands.

Additionally or alternatively, the determined characteristics of the magnetised body may in some embodiments of the present invention include an orientation of a magnetic dipole representing the magnetic moment of the magnetised body. For longitudinally magnetised bodies, the dipole alignment can enable identification of the alignment of the body itself.

The gradient of a field in three dimensions is a second rank tensor, and accordingly has nine components. In the case of static magnetic fields, for regions free of electric currents Maxwell's equations impose restrictions which imply that only five of the gradient components are independent. To determine the gradient tensor of a magnetic field it is therefore necessary to measure all five of these components. In preferred embodiments of the invention, each magnetic gradient tensor measurement may be obtained by use of a device of the type set out in International Patent Application No. WO 2004/015435, the content of which is incorporated herein by reference. However, any form of sensor that produces full gradient tensor measurements with sufficient sensitivity to detect targets of interest and an adequate bandwidth to define the entire frequency spectrum of the response due to relative motion of the sensor and magnetic source, can be used in this invention.

Embodiments of the present invention may comprise a single tensor gradiometer that moves relative to the target. Such a sensor may comprise an array of at least three non-collinear triaxial magnetometers, a set of three intrinsic single axis gradiometers rotating about differently oriented axes, arrays of intrinsic axial and/or planar gradiometers with referencing magnetometer(s), or other devices.

The present invention further recognises that obtaining measurements of the gradient tensor is advantageous, because measuring field components directly imposes heavy constraints on sensor orientation, sensor orientation stability, and accuracy of measurement of sensor orientation, if an anomalous field associated with an arbitrarily oriented magnetised body is to be determined in the presence of the very much larger geomagnetic field.

The present invention also recognises that the gradient tensor of a point dipole has the three mutually orthogonal eigenvectors, one of which must, from symmetry considerations, coincide with the normal to the plane that contains the dipole moment vector m and the sensor-to-dipole displacement vector r. This eigenvector is parallel to the vector, or cross, product m×r, and corresponds to the eigenvalue with the smallest absolute value. The other two eigenvectors lie within the plane containing m and r.

Furthermore, measuring the magnetic gradient tensor allows rotationally invariant parameters to be worked with, reducing the burden of sensor orientation. The eigenvalues of the gradient tensor, and combinations of them, are rotational invariants, which are much less sensitive to the presence of noise in the measured tensor elements than are the eigenvectors.

Preferred embodiments of the present invention further involve a two-step analysis of the gradient tensor, whereby scalar parameters of the source including the magnetic moment magnitude and the distance to the source at each measurement point are estimated from a profile segment of rotational invariants, and these solutions are then used to extract the vector parameters of the source, such as the direction to the source and the orientation of its magnetic moment. This invention further recognizes that specific rotational invariants that are independent of dipole orientation and spherically symmetric about the dipole location (the scaled moment and a parameter proportional to its square root), can be derived simply from the eigenvalues of the tensor and have particular utility for separating the scalar parameters of the DLC problem from the vector parameters, greatly simplifying its solution. This two-step approach also lends itself to iterative improvement of estimates of source parameters, by estimating and removing background interference terms from the measured rotational invariants and tensor elements, then repeating the analysis on the corrected profile data.

In preferred embodiments of the invention, one or more characteristics of the magnetised body are determined by deconvolving the scaled moment of a point dipole representation of the magnetised body. Alternatively, the square root of the scaled moment may be deconvolved for this purpose. Such embodiments recognise that the far field of a magnetised body is dominated by the dipole component and that working with the point dipole representation may thus provide sufficiently accurate measurement results while simplifying data processing. Such embodiments further recognise that the scaled moment of a dipole, and its square root, are useful rotational invariants suitable for such deconvolution, even in the presence of interference from other sources that produce background gradients.

In preferred embodiments of the invention the plurality of measurements are obtained as the sensor is moved along a substantially linear path.

In a first group of embodiments of the invention, deconvolution of the scaled moment profile of such measurements preferably comprises:

modelling the scaled moment and background interference terms determined from the measurements;

obtaining sufficient measurements to obtain an over-determined system of linear equations using the model;

solving the system of linear equations for unknown parameters of the model and for background gradients of various orders;

modelling the individual gradient tensor elements and background interference terms, incorporating scalar parameters that have been estimated in the previous steps; and solving the resulting system of linear equations for the remaining unknown parameters of the model and for background gradients of various orders.

In such embodiments the systems of linear equations may be solved directly by a least-squares best-fit pseudo inverse solution, but is preferably solved by a numerically robust method such as QR decomposition or singular value decomposition.

The scaled moment of a dipole source is defined as:

$$\mu = \frac{3m}{r^4},$$

where m is the magnitude of the dipole moment (in appropriate units) and r is the distance from the point dipole to the sensor. In the absence of interference from other sources, the scaled moment can be expressed as the following combination of eigenvalues:

$$\mu = \sqrt{-\lambda_2^2 - \lambda_1 \lambda_3},$$

where the eigenvalues of the gradient tensor in descending order are $\lambda_1 \geq \lambda_2 \geq \lambda_3$.

In the first group of embodiments of the invention the model of the scaled moment, as calculated from the eigenvalues of the gradient tensor, preferably comprises:

$$\mu_i = \frac{3m}{((x_i - x_0)^2 + S^2)^2} + a + bx_i + cx_i^2,$$

where $x_0$ is the co-ordinate of the point of closest approach along the measurement profile, $S = \sqrt{(Y^2 + h^2)}$ is the slant distance from the point of closest approach to the dipole, Y is the horizontal offset of the target dipole from the profile, h is the height of the profile above the target level, a is the base level, and b, c are coefficients of linear and quadratic terms that represent interference from other anomalies. In such embodiments, where the number of measurements obtained n is greater than 11, an over-determined system of linear equations arises, allowing solution of the system for the unknown parameters. Preferably, parameters for which more than one estimate arises are used as a check on the solution, or are solved by a parameter-specific system of over-determined equations. Such parameters, once calculated, are preferably used in turn to allow calculation of a solution for remaining parameters, until the moment m itself may be calculated by using the calculated parameters in the model being used.

In embodiments utilising such a model an iterative solution may be determined by first identifying the point of closest approach $x_0$ and then repeating all calculations with this point being used as origin.

In embodiments using the above model, at each sensor location the range from the sensor to the magnetised body may be determined by $$r_i = \left(\frac{3m}{\mu_i}\right)^{1/4}, \text{ or}$$

$$r_i = \sqrt{(x_i - x_0)^2 + S^2},$$

where the scaled moment $\mu_i$ has been corrected for background fields.

Preferably, complete information for source moment and location is derived from the individual magnetic gradient tensor elements. Such embodiments preferably comprise:

modelling the five independent measured gradient tensor elements in a second model based on known parameters of the model of the scaled moment;

solving the deconvolution problem of the second model for parameters giving at least one of: interference terms; magnetic moment source relative to the sensor; and sign and magnitude of the lateral displacement of the source from the point of closest approach.

In a second group of embodiments of the invention, deconvolution of the square root of the scaled moment is undertaken. Such embodiments may then solve for parameters of a model of the square root of the scaled moment and may solve for parameters of a model of the individual components of the gradient tensor, in a similar manner as for those embodiments of the first group described above. However, embodiments of the second group may be particularly advantageous in making the deconvolution problem mathematically equivalent to a Werner deconvolution of the TMI anomaly of a thin sheet. Furthermore, numerical stability of the inversion is greater for the second group, because the denominator of the square root of the scaled moment is only the second power of the distance, rather than the fourth power. Such embodiments may thus require a number of measurements n to be greater than 5 in order to provide for an over-determined system of linear equations for deconvolution.

BRIEF DESCRIPTION OF THE DRAWINGS

An example of the invention will now be described with reference to the accompanying drawings, in which.

DESCRIPTION OF THE PREFERRED EMBODIMENTS

Figure 1:
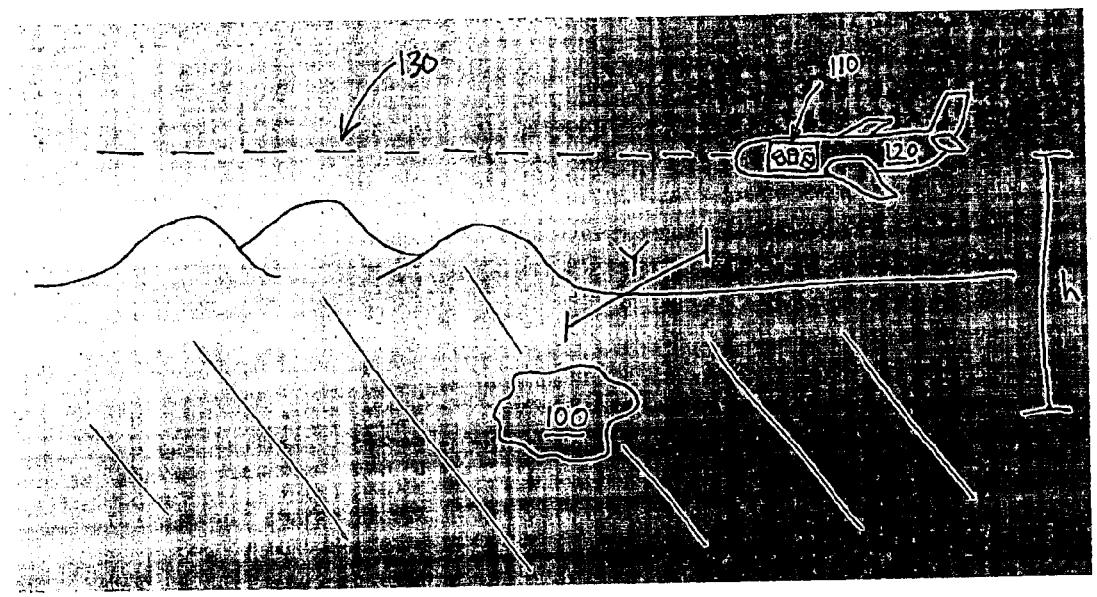
FIG. 1 illustrates a method of detecting and locating a magnetised body in accordance with the present invention.

FIG. 1 illustrates a method of detecting and locating a subterranean magnetised body 100 in accordance with the present invention. A sensor 110 for obtaining measurements of the complete magnetic gradient tensor is mounted in an aeroplane 120 which travels along a substantially straight and horizontal path 130. The path 130 is at an elevation h above the magnetised body 100. The path 130 is not directly above the magnetised body, but has a point of closest approach which is laterally spaced from the magnetised body by a horizontal distance Y.

While illustrated with respect to an airborne sensor in FIG. 1, it is to be appreciated that the present invention may be applied with respect to a sensor which is conveyed on land, underground, above water or underwater. Alternative applications may comprise a stationary tensor gradiometer which is used to track a magnetic object that moves along a quasi-linear path past the sensor at approximately constant known speed.

The present embodiment addresses the need for deconvolution along a profile of gradient tensor data arising from a point dipole source, in the possible presence of background gradients. The magnetic gradient tensor arising from the point dipole source is referred to as an anomaly. The point dipole model is applicable to any sufficiently compact magnetised body. Outside a spherical surface that completely encloses an arbitrary magnetised body, the field can be expressed as a sum of multipole contributions, with a $1/r^3$ fall-off for the dipole term, $1/r^4$ fall-off for the quadrupole, $1/r^5$ fall-off for the octupole term, and so on. Thus for any compact body with a non-zero dipole moment the far field is always dominated by the dipole term. More specifically, the external fields and gradients due to a uniformly magnetised sphere are identical to that of a point dipole, because the quadrupole and all higher multipole moments vanish identically.

For a uniformly magnetised body, the dipole moment $m=JV$, where V is the volume, $J=(J_x, J_y, J_z)=J(L, M, N)$ is the magnetisation vector, J is the magnetisation intensity, and L,M,N are the magnetisation vector's direction cosines with respect to the x,y,z axes. By Poisson's relation the scalar potential U due to a point pole p and the scalar potential V due to a point dipole m are related by:

$$V = -\frac{m \cdot \nabla U}{p} = -m \cdot \nabla(1/r),$$

$$\therefore V = \frac{m \cdot \hat{r}}{r^2},$$

where r is the displacement vector from the dipole to the observation point. In this and all subsequent equations, it is assumed that the magnetic moment incorporates a numerical factor, dependent on the system of magnetic units used, that relates calculated magnetic fields and gradients to the magnetization and volume of the source. For example, if the magnetization is given in A/m and distances are measured in metres, the moment in $Am^2$ should be multiplied by 100 nTm/A (=100 nH/m) to yield calculated fields in nT and gradients in nT/m.

The gradient tensor due to a point dipole is the gradient of the field vector, i.e.

$$B_{ij} = \nabla B = -\nabla \nabla V,$$

which gives:

$$B_{ij} = \frac{3m_i r_j + 3m_j r_i + 3(m \cdot r)\delta_{ij}}{r^5} - \frac{15(m \cdot r)r_i r_j}{r^7} \quad (i, j = 1, 2, 3).$$

For static magnetic fields and for the common case where conduction currents are negligible, the magnetic gradient tensor is symmetric and traceless. Then, at an observation point (x, y, 0) due to a point dipole at $(x_0, y_0, h)$, explicit expressions for the individual gradient tensor elements are:

$$B_{xx} = \frac{3m}{r^7}\{r^2[3L(x-x_0) + M(y-y_0) - Nh] -$$
$$5(x-x_0)^2[L(x-x_0) + M(y-y_0) - Nh]\},$$

$$B_{xy} = \frac{3m}{r^7}\{r^2[L(y-y_0) + M(x-x_0)] -$$
$$5(x-x_0)(y-y_0)[L(x-x_0) + M(y-y_0) - Nh]\},$$

$$B_{xz} = \frac{3m}{r^7}\{r^2[-Lh + N(x-x_0)] +$$
$$5(x-x_0)h[L(x-x_0) + M(y-y_0) - Nh]\},$$

$$B_{yy} = \frac{3m}{r^7}\{r^2[L(x-x_0) + 3M(y-y_0) - Nh] -$$
$$5(y-y_0)^2[L(x-x_0) + M(y-y_0) - Nh]\},$$

$$B_{yz} = \frac{3m}{r^7}\{r^2[-Mh + N(y-y_0)] +$$
$$5(y-y_0)h[L(x-x_0) + M(y-y_0) - Nh]\},$$

$$B_{zz} = \frac{3m}{r^7}\{r^2[L(x-x_0) + M(y-y_0) - 3Nh] -$$
$$5h^2[L(x-x_0) + M(y-y_0) - Nh]\}.$$

Note that the diagonal components are not independent because $B_{xx}+B_{yy}+B_{zz}=0$ (the tracelessness property) and that the remaining off-diagonal elements are determined by symmetry ($B_{yx}=B_{xy}$; $B_{zy}=B_{yz}$). Step 1 of FIG. 2a represents acquisition of at least all five independent gradient tensor elements, from which all nine components of the full tensor can be determined from symmetry and tracelessness, at a series of points along a traverse or at a series of times as a magnetic source passes by.

Eigenvectors of B satisfy by definition the relationship $Bv=\lambda v$, for some scalar $\lambda$, which is the eigenvalue corresponding to eigenvector v. The eigenvalues are found by solving the characteristic equation $det(B-\lambda I)=0$, where I is the identity matrix. The characteristic equation is a cubic equation in $\lambda$, which therefore has three roots which we label $\lambda_1, \lambda_2, \lambda_3$. Because the gradient tensor is symmetric, eigenvectors corresponding to distinct eigenvalues are mutually orthogonal and, in the case of two degenerate eigenvalues, three mutually orthogonal eigenvectors can always be found. Therefore three mutually orthogonal principal axes of the tensor, defined by unit eigenvectors, can always be found. Due to the tracelessness property and the rotational invariance of eigenvalues, the sum of the three eigenvalues is zero, so at least one eigenvalue is positive and at least one eigenvalue is negative. The intermediate eigenvalue may have either sign.

Figure 2A:
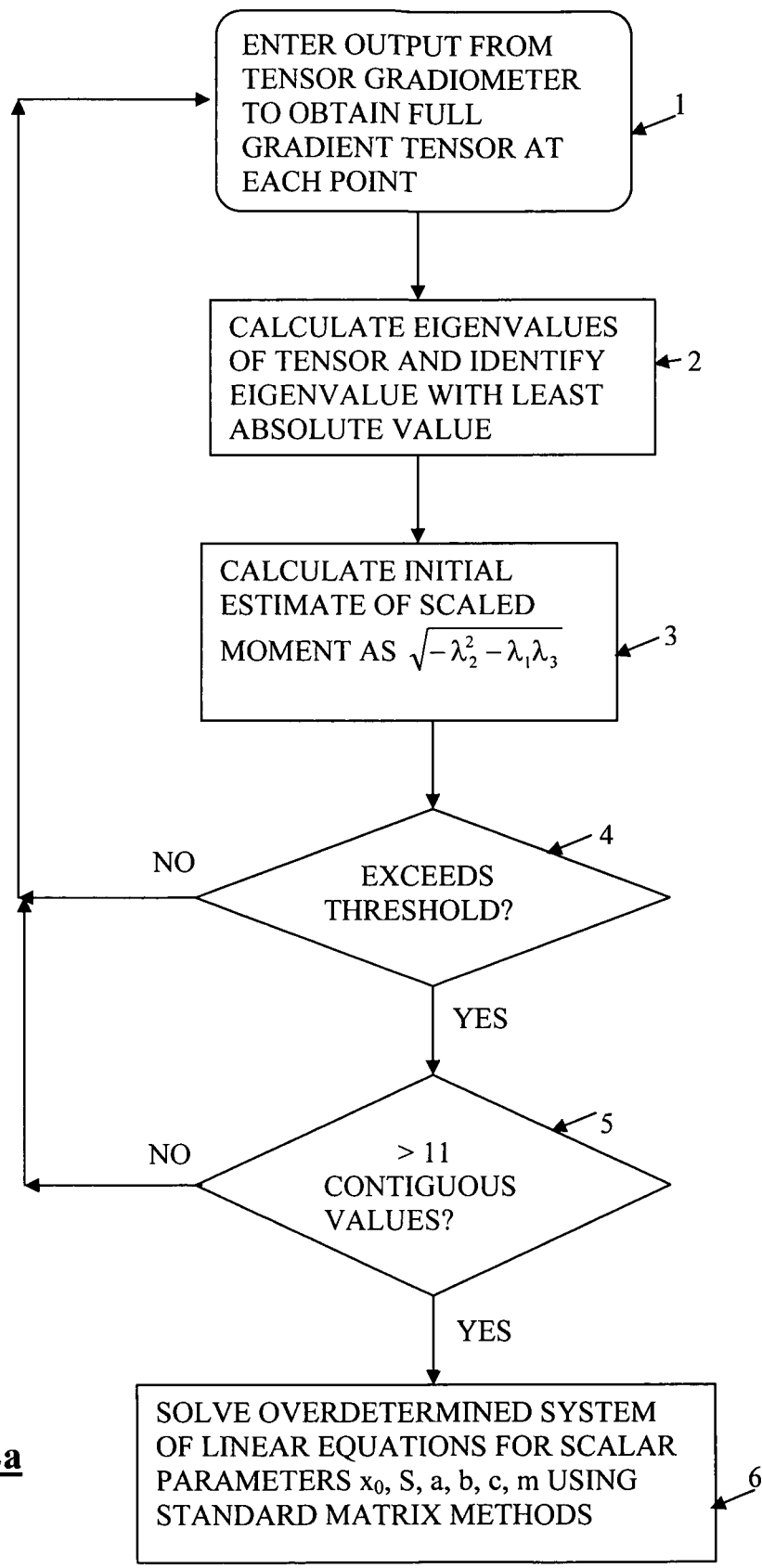
FIGS. 2a to 2d are a flowchart illustrating the algorithm for deconvolution of the scaled moment data.

Step 2 of FIG. 2a represents calculation of the eigenvalues for each of the gradient tensors acquired in step 1, using standard matrix methods. For each measurement point, the numerical order of the eigenvalues is determined. The eigenvalue with the smallest absolute value is denoted $\lambda_2$ for reasons that will become evident from the following.

The symmetry of the source-sensor geometry is lower for a dipole source than for a point pole. For a pole the source strength is a scalar and the geometry reflects only the source-sensor displacement vector. For a dipole, on the other hand, the source strength is a vector, the dipole moment, that has arbitrary orientation with respect to the displacement vector. The dipole moment and displacement vectors together define a plane, with normal parallel to their cross-product.

Since the gradient tensor has three orthogonal two-fold axes of symmetry, it is clear that one of these axes must coincide with the normal to the plane that contains the moment and displacement vectors. Thus one eigenvector is parallel to m×r and the other two eigenvectors lie within the plane containing m and r. It has been noted that the eigenvector $\mu \times \hat{r}$ has eigenvalue $\mu \cdot \hat{r} = \mu \cos \phi$, where $\phi$ is the angle between $\mu$ and r. To verify this, choose a co-ordinate system $(x_1, x_2, x_3)$ with $x_1$ directed along r, so that $x_1 = r$, $x_2 = x_3 = 0$, and with $x_3$ parallel to $\mu \times \hat{r}$. Then $m_1 = m \cos \phi$ and $m_2 = m \sin \phi$, where $\phi$ is positive from $x_1$ towards $x_2$. The gradient tensor elements with respect to these co-ordinates are:

$$B_{11} = \frac{-6m_1 x_1^3}{r^7} = \frac{-6m \cdot r}{r^5} = \frac{-6m \cdot \hat{r}}{r^4} = -2\mu \cdot \hat{r} = -2\mu\cos\phi,$$

$$B_{12} = \frac{3m_2 x_1^3}{r^7} = \frac{3m_2}{r^4} = \frac{3m}{r^4}\frac{m_2}{m} = \mu\sin\phi,$$

$$B_{13} = 0,$$

$$B_{22} = \frac{3m_1 x_1^2}{r^7} = \frac{3m_1}{r^4} = \mu\cos\phi,$$

$$B_{23} = 0,$$

$$B_{33} = \frac{3m_1 x_1}{r^5} = \frac{3m \cdot r}{r^5} = \frac{3m \cdot \hat{r}}{r^4} = \mu \cdot \hat{r} = \mu\cos\phi.$$

Thus the tensor has the form:

$$[B_{ij}] = \begin{bmatrix} B_{11} & B_{12} & 0 \\ B_{12} & B_{22} & 0 \\ 0 & 0 & B_{33} \end{bmatrix} = \mu \begin{bmatrix} -2\cos\phi & \sin\phi & 0 \\ \sin\phi & \cos\phi & 0 \\ 0 & 0 & \cos\phi \end{bmatrix},$$

which has characteristic equation:

$$\begin{vmatrix} B_{11} - \lambda & B_{12} & 0 \\ B_{12} & B_{22} - \lambda & 0 \\ 0 & 0 & B_{33} - \lambda \end{vmatrix} =$$

$$(B_{11} - \lambda)(B_{22} - \lambda)(B_{33} - \lambda) - B_{12}(B_{33} - \lambda)B_{12} = 0,$$

$$\therefore (B_{33} - \lambda)[(B_{11} - \lambda)(B_{22} - \lambda) - B_{12}^2] = 0,$$

which gives $$\lambda = B_{33} = \mu \cdot \hat{r} = \mu \cos\phi,$$

or $$\lambda^2 - (B_{11} + B_{22})\lambda + B_{11}B_{22} - B_{12}^2 = 0.$$

As expected from symmetry, an eigenvector corresponding to the eigenvalue $B_{33}$ is $(0,0,1)^T$, i.e. it is directed perpendicular to the (m,r) plane:

$$\begin{bmatrix} B_{11} & B_{12} & 0 \\ B_{12} & B_{22} & 0 \\ 0 & 0 & B_{33} \end{bmatrix} \begin{bmatrix} 0 \\ 0 \\ 1 \end{bmatrix} = \begin{bmatrix} 0 \\ 0 \\ B_{33} \end{bmatrix} = B_{33} \begin{bmatrix} 0 \\ 0 \\ 1 \end{bmatrix}.$$

We label this eigenvalue $\lambda_2$, as it turns out that this eigenvalue is always intermediate in numerical value.

The other eigenvalues are obtained by solving the quadratic equation given above:

$$\lambda_1 = \frac{B_{11} + B_{22} + \sqrt{(B_{11} - B_{22})^2 + 4B_{12}^2}}{2}$$

$$= \frac{-B_{33} + \sqrt{B_{33}^2 + 4(B_{12}^2 - B_{11}B_{22})}}{2},$$

$$\lambda_3 = \frac{B_{11} + B_{22} - \sqrt{(B_{11} - B_{22})^2 + 4B_{12}^2}}{2}$$

$$= \frac{-B_{33} - \sqrt{B_{33}^2 + 4(B_{12}^2 - B_{11}B_{22})}}{2},$$

Note that:

$$\begin{bmatrix} B_{11} & B_{12} & 0 \\ B_{12} & B_{22} & 0 \\ 0 & 0 & B_{33} \end{bmatrix} \begin{bmatrix} B_{12} \\ \lambda - B_{11} \\ 0 \end{bmatrix} = \begin{bmatrix} B_{11}B_{12} + B_{12}(\lambda - B_{11}) \\ B_{12}^2 + B_{22}(\lambda - B_{11}) \\ 0 \end{bmatrix}$$

$$= \begin{bmatrix} \lambda B_{12} \\ \lambda^2 - \lambda B_{11} \\ 0 \end{bmatrix}$$

$$= \lambda \begin{bmatrix} B_{12} \\ \lambda - B_{11} \\ 0 \end{bmatrix},$$

where the $x_2$ component of the RHS has been simplified by rearranging the quadratic equation for $\lambda$.

Therefore eigenvectors $u_i$ corresponding to $\lambda_i$ (i=1,3) are given by:

$$u_1 = \begin{bmatrix} B_{12} \\ \lambda_1 - B_{11} \\ 0 \end{bmatrix},$$

$$u_3 = \begin{bmatrix} B_{12} \\ \lambda_3 - B_{11} \\ 0 \end{bmatrix}.$$

The $x_2$ components of these two eigenvectors have opposite signs, as:

$$\lambda_1 - B_{11} = \frac{-(B_{11} - B_{22}) + \sqrt{(B_{11} - B_{22})^2 + 4B_{12}^2}}{2} \geq 0,$$

and $$\lambda_3 - B_{11} = \frac{-(B_{11} - B_{22}) - \sqrt{(B_{11} - B_{22})^2 + 4B_{12}^2}}{2} \leq 0,$$

with equality only if $B_{12}=0$, and $B_{11} \geq B_{22}$ (for the first case) or $B_{11} \leq B_{22}$ (for the second case).

In terms of the scaled moment $\mu$ and the angle $\phi$, the three eigenvalues in descending order are:

$$\lambda_1 = \frac{\mu}{2}\left(-\cos\phi + \sqrt{4 + 5\cos^2\phi}\right),$$

$$\lambda_2 = \mu\cos\phi,$$

-continued
$$\lambda_3 = \frac{\mu}{2}\left(-\cos\phi - \sqrt{4 + 5\cos^2\phi}\right),$$

where $\lambda_1 \geq \lambda_2 \geq \lambda_3$ and $\lambda_2$ is always the eigenvalue with the smallest absolute value.

A commonly used rotational invariant is the contraction of the tensor on itself:

$$B \ldots B = \sum_i \sum_j B_{ij} B_{ji} = B_{xx}^2 + 2B_{xy}^2 + 2B_{xz}^2 + B_{yy}^2 + 2B_{yz}^2 + B_{zz}^2.$$

With respect to principal axes therefore $$B..B = \lambda_1^2 + \lambda_2^2 + \lambda_3^2.$$

The contraction can be written in terms of the scaled moment and $\phi$ as $$B \ldots B = 2\mu^2(1 + 2\cos^2\phi) = \frac{18m^2}{r^8}(1 + 2\cos^2\phi).$$

Thus for a given range the tensor contraction is maximum when the moment vector is aligned with the source-sensor axis (the so-called Gauss A position), and minimum when $\phi = 90°$, i.e. when the sensor is broadside or in the Gauss B position with respect to the moment. Although the contraction measured along a track is very sensitive to the range and peaks in the vicinity of the point of closest approach, which for example makes it a useful parameter for homing onto a target by a tensor gradiometer system mounted on a manoeuverable platform, in general the maximum does not strictly coincide with the point of closest approach, due to the dependence on $\phi$. The surfaces of constant B..B around a point dipole are rotationally symmetric about the dipole axis. Their long axes are aligned with the dipole moment and are 1.147 times larger than the equatorial short axes.

A particularly useful rotational invariant is the scaled moment, which can be expressed as the following combination of eigenvalues:

$$\mu = \frac{3m}{r^4} = \sqrt{-\lambda_2^2 - \lambda_1 \lambda_3}.$$

Thus, in the absence of interfering anomalies, the scaled moment of a dipole source at any measurement point can be calculated directly from the eigenvalues of the gradient tensor at that point. The present invention recognises that a major virtue of the scaled moment is that it depends only on the range and is independent of the orientation of the dipole moment and the source-sensor axis, unlike the aforementioned invariants, which depend on $\phi$. The surfaces of constant $\mu$ around a point dipole are spherical.

The present embodiment thus recognises that a useful rotational invariant for inversion to obtain certain source parameters is the scaled moment, which can be expressed as the following combination of eigenvalues:

$$\mu = \frac{3m}{r^4} = \sqrt{-\lambda_2^2 - \lambda_1 \lambda_3}.$$

Step 3 of FIG. 2a represents calculation of this initial estimate of the scaled moment from the eigenvalues. For a pure dipole signature, this estimate will correspond to the actual scaled moment of the source. If the estimated scaled moment exceeds a threshold level, indicating detection of a signal from a magnetic source above the background noise level, logic switch 4 of FIG. 2a retains this value for the next stage of processing, otherwise data continues to be acquired until the scaled moment threshold is exceeded. When sufficient (>11) successive values of the estimated scaled moment have been acquired, logic switch 5 of FIG. 2a initiates deconvolution of the scaled moment profile (step 6 of FIG. 2a), to extract the desired characteristics of the magnetised body. At successive points $x = x_i$ ($i = 1, 2, \ldots, n$) along a straight and level path, defined by $y - y_0 = Y$, the scaled moment determined from the measured data can be modelled as:

$$\mu_i = \frac{3m}{((x_i - x_0)^2 + S^2)^2} + a + bx_i + cx_i^2,$$

where $S = \sqrt{(Y^2 + h^2)}$ is the slant distance from the point of closest approach to the dipole, a is the base level, and b, c are linear and quadratic terms that represent interference from other anomalies and departures from a pure dipole signature. It should be noted that the method can be generalized, in a relatively straightforward fashion, to include higher order background terms in cases of large and complex interference from other anomalies, at the possible expense of some robustness of the solution. Correction of the observed gradient tensor profiles for interference terms and departures from a pure dipole signature is a unique aspect of this method and suppresses systematic errors that can afflict other solutions to the DLC problem.

The deconvolution problem is to solve for the unknown parameters $x_0$, S, m, a, b, c. Multiplying out, rearranging and writing in matrix form gives $Mu = v$, where:

$$M = \begin{bmatrix} 1 & x_1 & x_1^2 & x_1^3 & x_1^4 & x_1^5 & x_1^6 & \mu_1 & \mu_1 x_1 & \mu_1 x_1^2 & \mu_1 x_1^3 \\ 1 & x_2 & x_2^2 & x_2^3 & x_2^4 & x_2^5 & x_2^6 & \mu_2 & \mu_2 x_2 & \mu_2 x_2^2 & \mu_2 x_2^3 \\ \vdots & \vdots & \vdots & \vdots & \vdots & \vdots & \vdots & \vdots & \vdots & \vdots & \vdots \\ 1 & x_n & x_n^2 & x_n^3 & x_n^4 & x_n^5 & x_n^6 & \mu_n & \mu_n x_n & \mu_n x_n^2 & \mu_n x_n^3 \end{bmatrix}$$

$$u = \begin{bmatrix} 3m + (x_0^2 + S^2)^2 a \\ -4x_0(x_0^2 + S^2)a + (x_0^2 + S^2)^2 b \\ (6x_0^2 + 2S^2)a - 4x_0(x_0^2 + S^2)b + (x_0^2 + S^2)^2 c \\ -4x_0 a + (6x_0^2 + 2S^2)b - 4x_0(x_0^2 + S^2)c \\ a - 4x_0 b + (6x_0^2 + 2S^2)c \\ b - 4x_0 c \\ c \\ -(x_0^2 + S^2)^2 \\ 4x_0(x_0^2 + S^2) \\ -6x_0^2 - 2S^2 \\ 4x_0 \end{bmatrix}$$

$$v = \begin{bmatrix} \mu_1 x_1^4 \\ \mu_2 x_2^4 \\ \vdots \\ \mu_n x_n^4 \end{bmatrix}.$$

M is an n×11 matrix, u is an 11×1 column vector and v is n×1. For n>11 this matrix equation defines an over-determined system of linear equations in combinations of the unknown parameters. The least-squares best-fit solution to this system of equations can be written formally as:

$$u = \begin{bmatrix} u_1 \\ u_2 \\ u_3 \\ u_4 \\ u_5 \\ u_6 \\ u_7 \\ u_8 \\ u_9 \\ u_{10} \\ u_{11} \end{bmatrix} = (M^T M)^{-1} M^T v.$$

In practice, because the square matrix $M^T M$ is often ill-conditioned, the matrix equation Mu=v should be solved by a numerically robust method such as QR decomposition or singular value decomposition. The unknown parameters of interest are given by:

$$x_0 = u_{11}/4,$$

$$S = \sqrt{(-u_{10} - 3u_{11}^2/8)/2}, \text{ or}$$

$$S = \sqrt{u_9/u_{11} - u_{11}^2/16}, \text{ or}$$

$$S = \sqrt{-u_8 - u_{11}^2/16},$$

$$c = u_7,$$

$$b = u_6 + u_{11} u_7,$$

$$a = u_5 + u_{11}(u_6 + u_{11} u_7)_7 + u_{10} u_7, \text{ or}$$

$$a = -[u_2 + u_8(u_6 + u_{11} u_7)]/u_9,$$

$$m = (u_1 + a u_8)/3.$$

Three independent estimates of the slant distance S and two estimates of the base level term, a, occur and can be used as a check on the solution. A more rigorous approach to estimating $x_0$ and S is to solve the over-determined system of equations:

$$\begin{bmatrix} 16 & 0 \\ -6 & -2 \\ 1 & 1 \\ 1 & 1 \end{bmatrix} \begin{bmatrix} x_0^2 \\ S^2 \end{bmatrix} = \begin{bmatrix} u_{11}^2 \\ u_{10} \\ u_9/u_{11} \\ \sqrt{-u_8} \end{bmatrix},$$

which has the least squares solution:

$$\begin{bmatrix} x_0^2 \\ S^2 \end{bmatrix} = \begin{bmatrix} 3u_{11}^2/49 - (u_{10} + u_9/u_{11} + \sqrt{-u_8})/196 \\ -u_{11}^2/7 - 9u_{10}/28 + 5(u_9/u_{11} + \sqrt{-u_8})/28 \end{bmatrix}.$$

Then $x_0$ and S can be determined by taking square roots, noting that S>0 and that $x_0$ has the same sign as $u_{11}$.

Once the origin and slant distance are estimated the interference parameters a, b, c can also be least-squares estimated by solving the over-determined system:

$$\begin{bmatrix} -4x_0(x_0^2 + S^2) & (x_0^2 + S^2)^2 & 0 \\ 6x_0^2 + 2S^2 & -4x_0(x_0^2 + S^2) & (x_0^2 + S^2)^2 \\ -4x_0 & 6x_0^2 + 2S^2 & -(x_0^2 + S^2)^2 \\ 1 & -4x_0 & 6x_0^2 + 2S^2 \\ 0 & 1 & -4x_0 \\ 0 & 0 & 1 \end{bmatrix} \begin{bmatrix} a \\ b \\ c \end{bmatrix} = \begin{bmatrix} u_2 \\ u_3 \\ u_4 \\ u_5 \\ u_6 \\ u_7 \end{bmatrix}.$$

Finally, the moment is calculated as:

$$m = [u_1 - (x_0^2 + S^2)^2 a]/3.$$

Figure 2B:
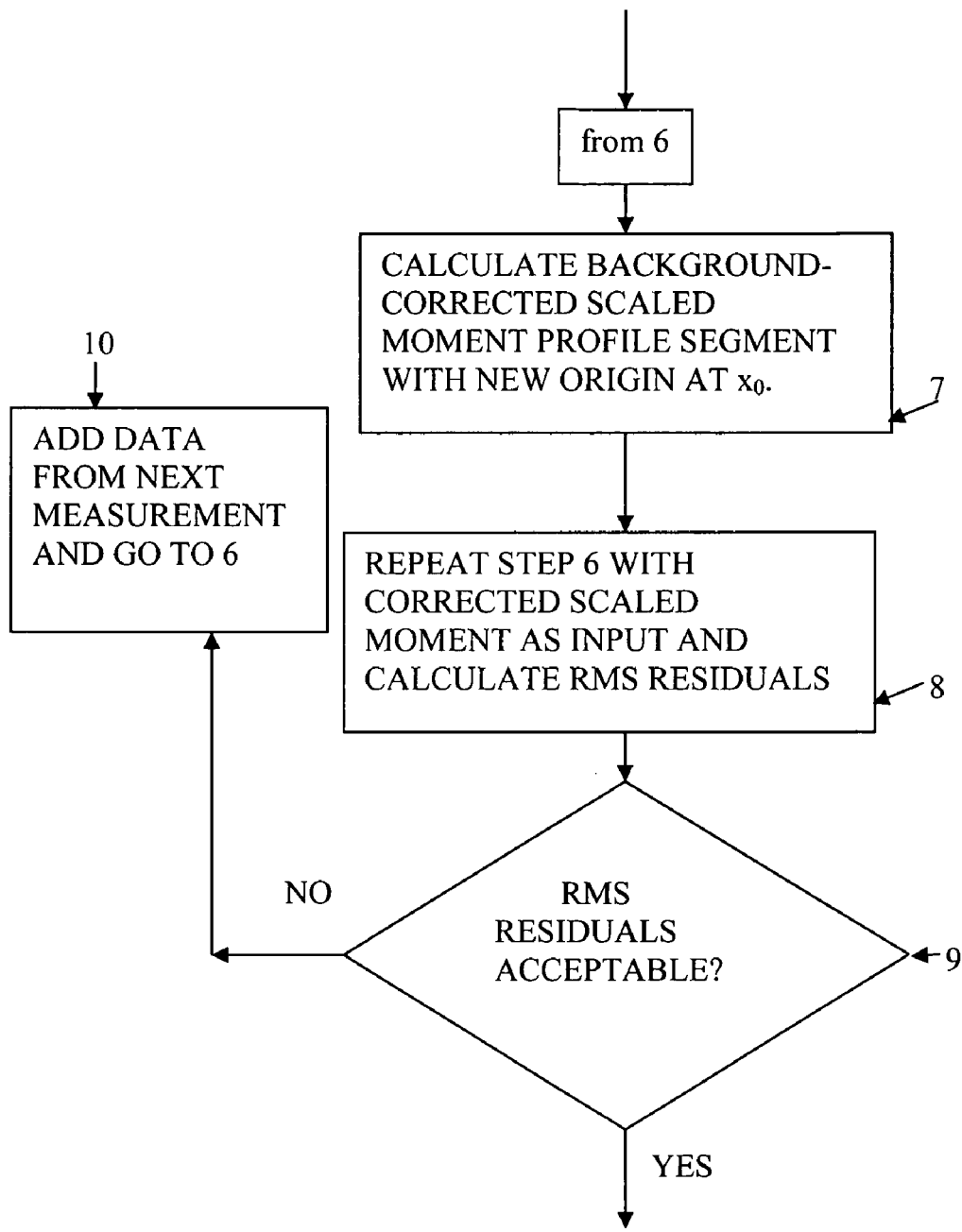

An iterative procedure may be useful, where the point of closest approach $x = x_0$ is identified and the calculations repeated with this value subtracted from all profile co-ordinates, i.e. with the closest approach point as origin (step 7 of FIG. 2b). Then:

$$(M^T M)^{-1} M^T v \approx u.$$

The parameters of interest are directly determined, with the magnitude of the $u_2$ and $u_4$ terms providing an indication of error. The process can be repeated with the estimated interference removed from the original data (step 8 of FIG. 2b). Logic switch 9 decides whether the fit of the model to the measured data is acceptable. If not, another data point is included in the analysis (step 10 of FIG. 2b). The background-corrected scaled moment peaks at the point of closest approach, where it is equal to $m/S^4$. When the modelled scaled moment is well fitted by the data, the refined estimate of m is used in subsequent analysis (step 11 of FIG. 2c).

At each measurement point the distance to the dipole is given by (step 12 of FIG. 2c):

$$r_i = \left(\frac{3m}{\mu_i}\right)^{1/4}, \text{ or}$$

$$r_i = \sqrt{(x_i - x_0)^2 + S^2},$$

where the scaled moment in this and all subsequent expressions is assumed to have been corrected for background fields.

The minor eigenvalue at each point is:

$$(\lambda_2)_i = \mu_i \cos\phi_i = m_x \frac{(x_i - x_0)}{r_i^5} + m_y \frac{Y}{r_i^5} - m_z \frac{h}{r_i^5} = m_x \frac{(x_i - x_0)}{r_i^5} + m_{z'} \frac{S}{r_i^5},$$

$$\therefore (\lambda_2)_i r_i^5 = (\lambda_2)_i \left(\frac{3m}{\mu_i}\right)^{5/4} = m_x x_i - m_x x_0 + m_{z'} S,$$

where z' denotes the rotated co-ordinate axis from the point of closest approach to the dipole. Therefore a linear regression of $r_i^5(\lambda_2)_i$ on $x_i$ can be used to estimate the along-profile magnetic moment $m_x$ from the slope of the linear regression and the "slant" magnetic moment $m_{z'}$ from the intercept. That is, $$(\lambda_2)_i r_i^5 \approx a + bx_i \Rightarrow m_x = b, \, m_{z'} = \frac{a + bx_0}{S}.$$

Complete information about the source moment and location is unobtainable from the values of these two scalars alone. The extra information to determine these quantities must be extracted from the individual tensor elements.

Once the origin of x and slant distance are determined and the scaled moment, $\mu_i$, and distance to source, $r_i$, at successive points are known, the five independent measured gradient tensor elements can be modelled by:

$$B_{xx}^{(i)} = -\frac{\mu_i}{r_i^3}[2Lx_i^3 + 4M'x_i^2 - 3LS^2 x_i - M'S^3] + a_{xx} + b_{xx}x_i + c_{xx}x_i^2,$$

$$B_{xy}^{(i)} = \frac{\mu_i}{r_i^3}[Mx_i^3 - 4LYx_i^2 - (4MY^2 - Mh^2 - 5NYh)x_i + LYS^2] +$$
$$a_{xy} + b_{xy}x_i + c_{xy}x_i^2,$$

$$B_{xz}^{(i)} = \frac{\mu_i}{r_i^3}[Nx_i^3 + 4Lhx_i^2 + (NY^2 - 4Nh^2 + 5MYh)x_i - LhS^2] +$$
$$a_{xz} + b_{xz}x_i + c_{xz}x_i^2,$$

$$B_{yy}^{(i)} = -\frac{\mu_i}{r_i^3}[Lx_i^3 + (3MY - Nh)x_i^2 - L(4Y^2 - h^2)x_i +$$
$$MY(3h^2 - 2Y^2) + Nh(4Y^2 - h^2)] + a_{yy} + b_{yy}x_i + c_{yy}x_i^2,$$

$$B_{yz}^{(i)} = \frac{\mu_i}{r_i^3}[(NY - Mh)x_i^2 + 5LYhx_i + Mh(4Y^2 - h^2) + NY(Y^2 - 4h^2)] +$$
$$a_{yz} + b_{yz}x_i + c_{yz}x_i^2.$$

where the distances along the profile, $x_i$, are now with respect to an origin at the point of closest approach. M' is direction cosine of the slant component of magnetization and a quadratic interference term is assumed for each component. M' obeys the following relations:

$$M' = \frac{m_{z'}}{m},$$

$$M'S = MY - Nh.$$

The deconvolution problem is to solve for the unknown parameters L, M, N, Y, h and the interference terms $a_{ij}$, $b_{ij}$, $c_{ij}$. Multiplying out and rearranging gives (step 13 of FIG. 2c):

$$Mu = v,$$

$$\therefore u = (M^T M)^{-1} M^T v,$$

where M is an n×7 matrix, u is 7×5 and v is an n×5 column vector, which are given by:

$$M = \begin{bmatrix} 1 & x_1 & x_1^2 & x_1^3 & r_1^3/\mu_1 & r_1^3 x_1/\mu_1 & r_1^3 x_1^2/\mu_1 \\ 1 & x_2 & x_2^2 & x_2^3 & r_2^3/\mu_2 & r_2^3 x_2/\mu_2 & r_2^3 x_2^2/\mu_2 \\ \vdots & \vdots & \vdots & \vdots & \vdots & \vdots & \vdots \\ 1 & x_n & x_n^2 & x_n^3 & r_n^3/\mu_n & r_n^3 x_n/\mu_n & r_n^3 x_n^2/\mu_n \end{bmatrix}$$

$$u = \begin{bmatrix} M'S^3 & LYS^2 & -LhS^2 & MY(3h^2 - 2Y^2) - Nh(h^2 - 4Y^2) & (NY - Mh)(S^2 - 5hY) \\ 3LS^2 & 5NYh - 4MY^2 + Mh^2 & NY^2 - 4Nh^2 + 5MYh & L(h^2 - 4Y^2) & 5LYh \\ -4M'S & -4LY & 4Lh & 3MY - Nh & NY - Mh \\ -2L & M & N & L & 0 \\ a_{xx} & a_{xy} & a_{xz} & a_{yy} & a_{yz} \\ b_{xx} & b_{xy} & b_{xz} & b_{yy} & b_{yz} \\ c_{xx} & c_{xy} & c_{xz} & c_{yy} & c_{yz} \end{bmatrix},$$

$$v = \begin{bmatrix} r_1^3 B_{xx}^{(1)}/\mu_1 & r_1^3 B_{xy}^{(1)}/\mu_1 & r_1^3 B_{xz}^{(1)}/\mu_1 & r_1^3 B_{yy}^{(1)}/\mu_1 & r_1^3 B_{yz}^{(1)}/\mu_1 \\ r_2^3 B_{xx}^{(2)}/\mu_2 & r_2^3 B_{xy}^{(2)}/\mu_2 & r_2^3 B_{xz}^{(2)}/\mu_2 & r_2^3 B_{yy}^{(2)}/\mu_2 & r_2^3 B_{yz}^{(2)}/\mu_2 \\ \vdots & \vdots & \vdots & \vdots & \vdots \\ r_n^3 B_{xx}^{(n)}/\mu_n & r_n^3 B_{xy}^{(n)}/\mu_n & r_n^3 B_{xz}^{(n)}/\mu_n & r_n^3 B_{yy}^{(n)}/\mu_n & r_n^3 B_{yz}^{(n)}/\mu_n \end{bmatrix}.$$

Figure 2C:
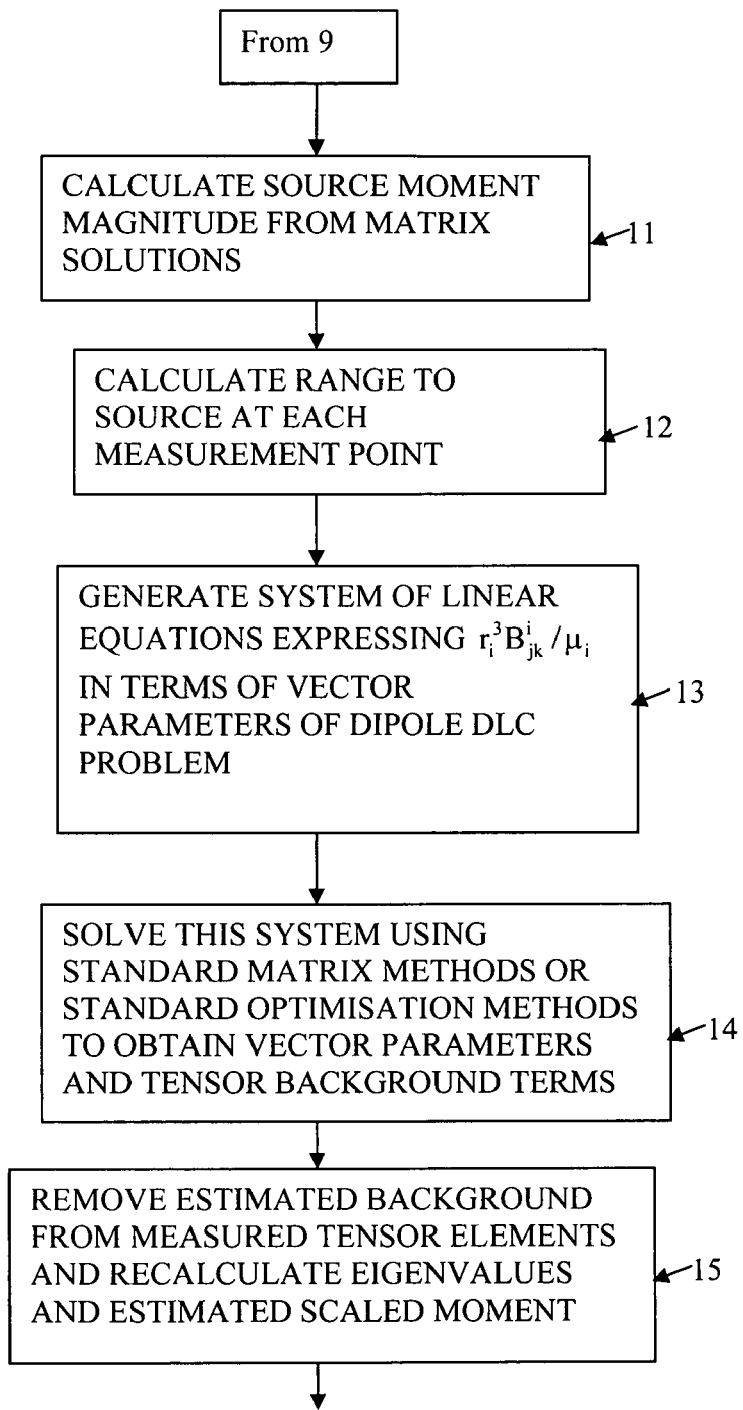

Step 14 of FIG. 2c represents solving this overdetermined matrix equation by standard methods. The interference parameters are obtained directly from the generalized inverse matrix u:

$a_{xx} = u_{51}$, $a_{xy} = u_{52}$, $a_{xz} = u_{53}$, $a_{yy} = u_{54}$, $a_{yz} = u_{55}$,
$b_{xx} = u_{61}$, $b_{xy} = u_{62}$, $b_{xz} = u_{63}$, $b_{yy} = u_{64}$, $b_{yz} = u_{65}$,
$c_{xx} = u_{71}$, $c_{xy} = u_{72}$, $c_{xz} = u_{73}$, $c_{yy} = u_{74}$, $c_{yz} = u_{75}$.

At this stage it may be optimal to remove the interference terms from the measured tensor elements and recalculate the eigenvalues and scaled moment (step 15 of FIG. 2c). Using the new estimates of $x_0$, S, m the deconvolution of the tensor elements can be repeated. If the process is convergent, as expected, the revised interference terms should be small (as tested by logic switch 16 of FIG. 2d) and the source parameters should be more precisely determined.

Figure 2D:
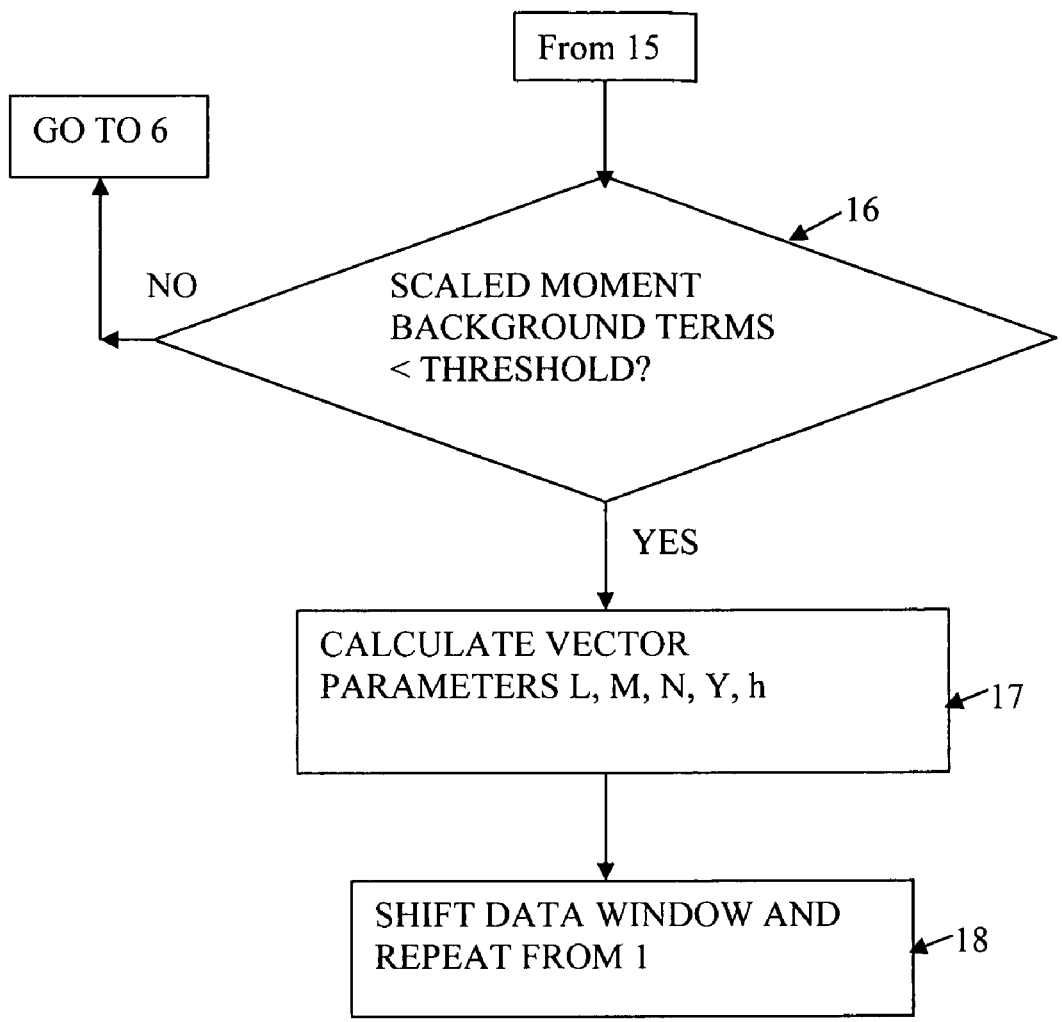

The other parameters can be obtained from the elements of u in a sequential manner (step 17 of FIG. 2d). First we have:

$M = u_{42}$, $N = u_{43}$.

Because the other parameters occur in more than one element, each subsequent step can be a least-squares estimate. The least-squares estimate for L is:

$$L = \frac{u_{44} - 2u_{41}}{5}.$$

Now that the direction cosines of the magnetic moment (L, M, N) are determined, the parameters Y and h can be estimated by inverting the overdetermined system:

$$\begin{bmatrix} -4M & 4N \\ -4L & 0 \\ 0 & 4L \\ 3M & -N \\ N & -M \\ 1 & 0 \\ 0 & 1 \\ MS^2 & -NS^2 \end{bmatrix} \begin{bmatrix} Y \\ h \end{bmatrix} = \begin{bmatrix} u_{31} \\ u_{32} \\ u_{33} \\ u_{34} \\ u_{35} \\ 3u_{12}/u_{21} \\ -3u_{13}u_{21} \\ u_{11} \end{bmatrix}.$$

At this stage all the parameters of the dipole model have been estimated. However, a further check on the consistency of the solutions can be made by inverting the over-determined system:

$$\begin{bmatrix} 0 & 3L & 3L \\ 5N & -4M & M \\ 5M & N & -4N \\ 0 & -4L & L \\ 5L & 0 & 0 \\ 0 & 1 & 1 \\ 0 & 1 & 1 \\ 0 & 1 & 1 \\ 0 & 5u_{31} + 4u_{34} & 4u_{34} \\ -5 & 1 & 1 \end{bmatrix} \begin{bmatrix} Yh \\ Y^2 \\ h^2 \end{bmatrix} = \begin{bmatrix} u_{21} \\ u_{22} \\ u_{23} \\ u_{24} \\ u_{25} \\ -4u_{11}/u_{31} \\ -4u_{12}/u_{32} \\ -4u_{13}/u_{33} \\ 4u_{14} \\ u_{15}/u_{35} \end{bmatrix}.$$

The values of $Y^2$, $h^2$ and Yh determined from the generalized inverse of this matrix equation should be consistent with the values of Y and h estimated from the previous step, and the sum $Y^2 + h^2$ should be close to the value of $S^2$ obtained from the analysis of the scaled moment. When the solution of the source and background parameters is complete for the given data window, the data window can be shifted and the entire process repeated (step 18 of FIG. 2d).

While the embodiment described in the preceding models the scaled moment, other parameters determined from the measured data may be suitable for modeling in alternative embodiments of the invention. One such alternative embodiment is described in the following, which provides a simplified deconvolution of the scaled moment profile.

Figure 3A:
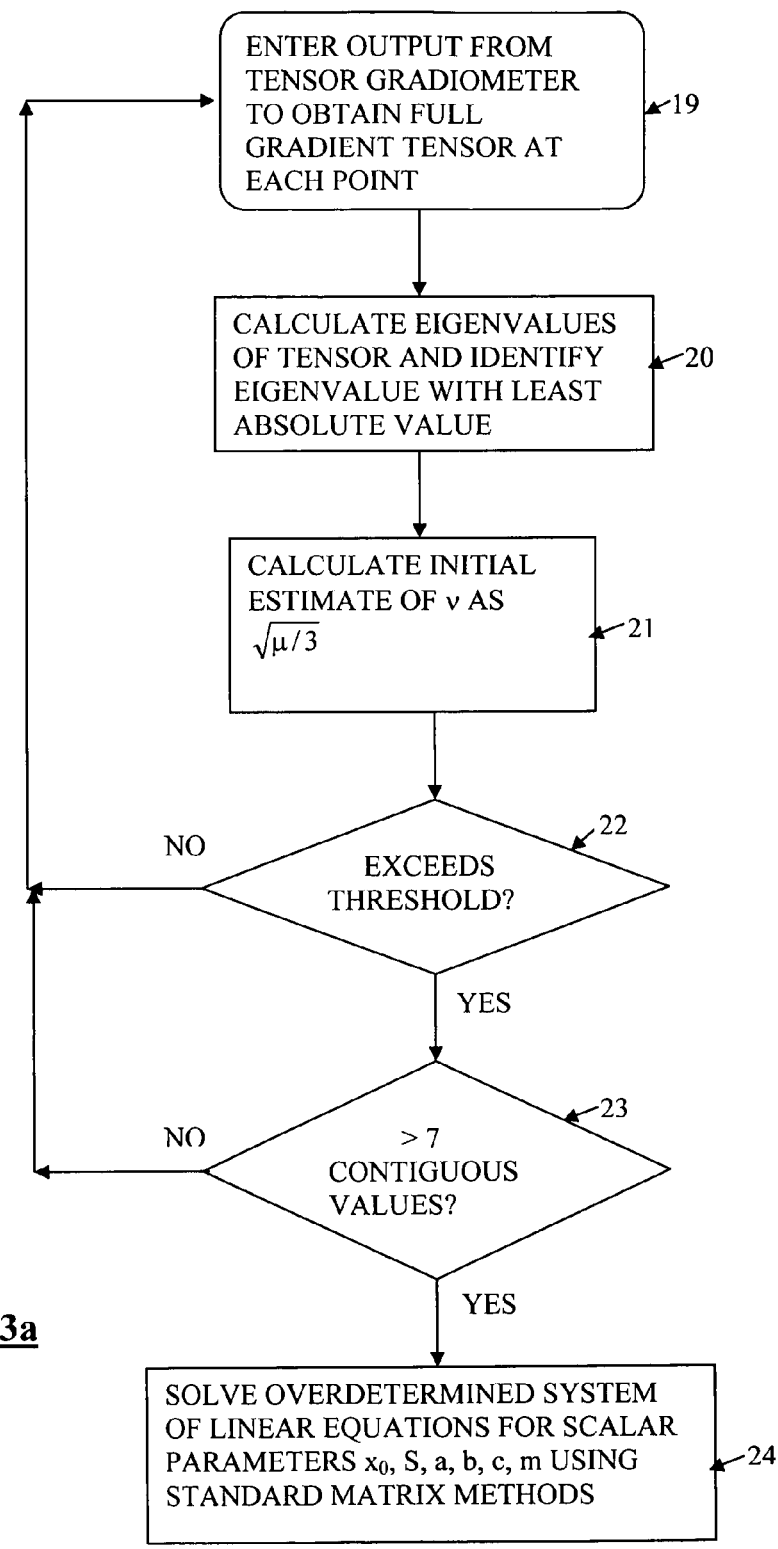
FIG. 3 is a flowchart illustrating the algorithm for deconvolution of the square root of (the scaled moment)/3.

Step 19 of FIG. 3a represents acquisition of all five independent gradient tensor elements, from which all nine components of the full tensor can be determined from symmetry and tracelessness, at a series of points along a traverse or at a series of times as a magnetic source passes by. Step 20 of FIG. 3a represents calculation of the eigenvalues for each of the gradient tensors acquired in step 1, using standard matrix methods. For each measurement point, the numerical order of the eigenvalues is determined. In this embodiment, a new parameter v is defined at each point by:

$$v = \sqrt{\frac{\mu}{3}} = \frac{\sqrt{m}}{(x-x_0)^2 + S^2}.$$

At successive points $x = x_i$ (i=1, 2, ..., n) along a straight and level path, defined by $y - y_0 = Y$, this new parameter, as determined from the measured data (step 21 of FIG. 3a), can be modelled by:

$$v_i = \frac{\sqrt{m}}{(x_i - x_0)^2 + S^2} + a + bx_i + cx_i^2,$$

where $S = \sqrt{(Y^2 + h^2)}$ is the slant distance from the point of closest approach to the dipole, a is the base level, and b, c are linear and quadratic terms that represent interference from other anomalies.

If the estimated value of v exceeds a threshold level, indicating detection of a signal from a magnetic source above the background noise level, logic switch 22 of FIG. 3a retains this value for the next stage of processing, otherwise data continue to be acquired until the scaled moment threshold is exceeded. When sufficient (>7) successive values of the estimated v have been acquired, logic switch 23 of FIG. 3a initiates deconvolution of the scaled moment profile (step 24 of FIG. 3a), to extract the desired characteristics of the magnetised body.

The deconvolution problem in this embodiment is to solve for the unknown parameters $x_0$, S, m, a, b, c. Advantageously, this is equivalent to conventional Werner deconvolution of the TMI anomaly of a thin sheet. Multiplying out, rearranging and writing in matrix form gives Mu=v, where:

$$M = \begin{bmatrix} 1 & x_1 & x_1^2 & x_1^3 & x_1^4 & v_1 & v_1 x_1 \\ 1 & x_2 & x_2^2 & x_2^3 & x_2^4 & v_2 & v_2 x_2 \\ \vdots & \vdots & \vdots & \vdots & \vdots & \vdots & \vdots \\ 1 & x_n & x_n^2 & x_n^3 & x_n^4 & v_n & v_n x_n \end{bmatrix}$$

$$v = \begin{bmatrix} v_1 x_1^2 \\ v_2 x_2^2 \\ \vdots \\ v_n x_n^2 \end{bmatrix}.$$

$$u = \begin{bmatrix} \sqrt{m} + a(x_0^2 + S^2) \\ b(x_0^2 + S^2) - 2x_0 a \\ a - 2x_0 b + c(x_0^2 + S^2) \\ b - 2x_0 c \\ c \\ -(x_0^2 + S^2) \\ 2x_0 \end{bmatrix}$$

M is an n×7 matrix, u is a 7×1 column vector and v is n×1. For n>7 this matrix equation defines an over-determined system of linear equations in combinations of the unknown parameters. The least-squares best-fit solution to this system of equations can be written formally as the pseudo inverse:

$$u = \begin{bmatrix} u_1 \\ u_2 \\ u_3 \\ u_4 \\ u_5 \\ u_6 \\ u_7 \end{bmatrix} = (M^T M)^{-1} M^T v.$$

In practice, because the square matrix $M^T M$ is often ill-conditioned, the matrix equation $Mu=v$ should be solved by a numerically robust method such as QR decomposition or singular value decomposition.

The unknown parameters of interest are given by:

$x_0 = u_7/2$, $S = \sqrt{(-u_6 - u_7^2/4)}$, $c = u_5$, $b = u_4 + u_5 u_7$, $a = u_3 + u_7 b + u_5 u_6$, or $a = -(u_2 + u_6 b)/u_7$, $m = (u_1 + a u_6)^2$.

As can be seen two estimates of the base level term, a, occur and can be used as a check on the solution. A more rigorous approach to estimating a, b, c is to solve the over-determined system of equations:

$$\begin{bmatrix} -u_7 & -u_6 & 0 \\ 1 & -u_7 & -u_6 \\ 0 & 1 & -u_7 \\ 0 & 0 & 1 \end{bmatrix} \begin{bmatrix} a \\ b \\ c \end{bmatrix} = \begin{bmatrix} u_2 \\ u_3 \\ u_4 \\ u_5 \end{bmatrix}.$$

Figure 3B:
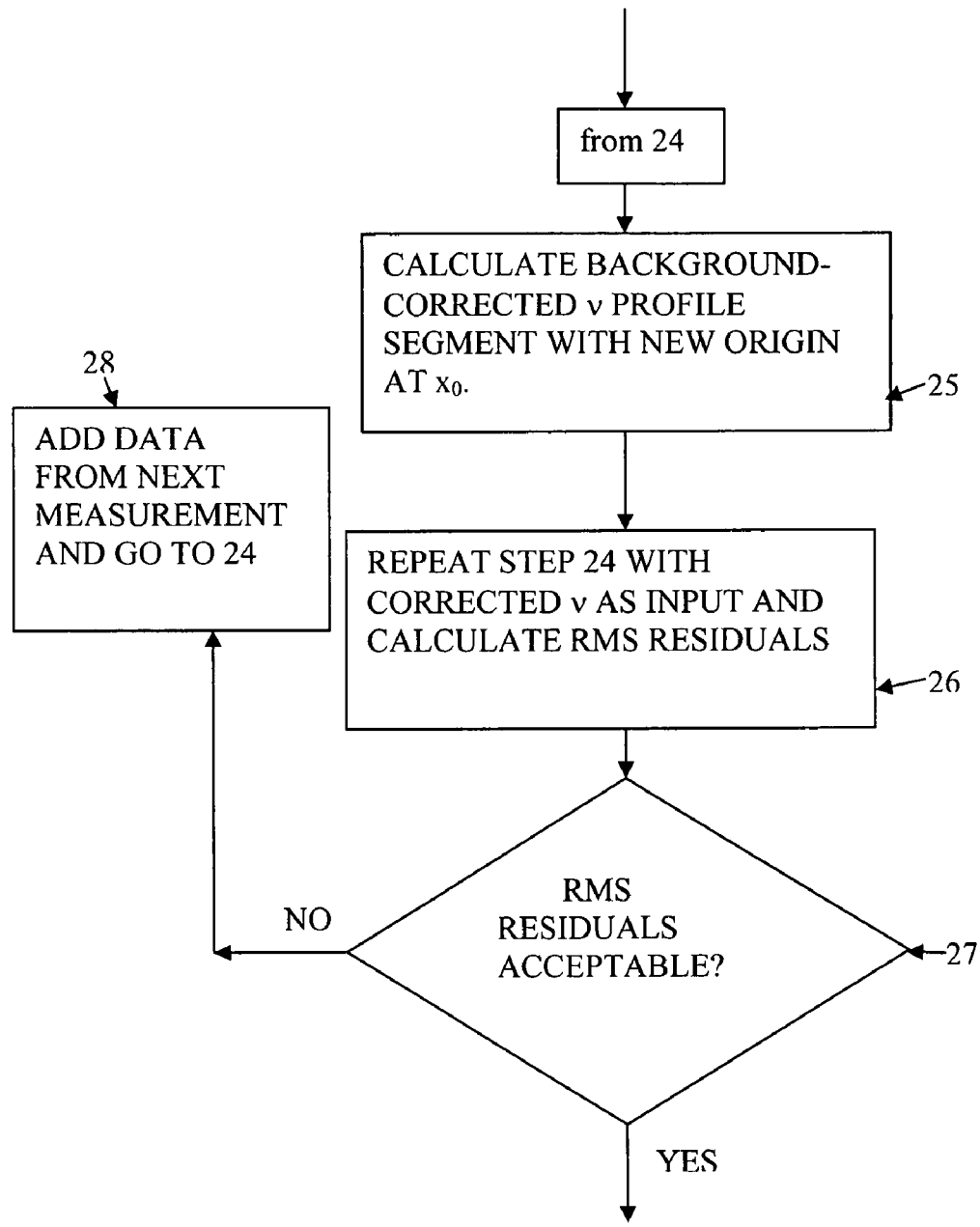

An iterative procedure may be useful, where the point of closest approach $x=x_0$ is identified and the calculations repeated with this value subtracted from all profile co-ordinates, i.e. with the closest approach point as origin (step 25 of FIG. 3b). Then:

$(M^T M)^{-1} M^T v \approx u.$

Figure 3C:
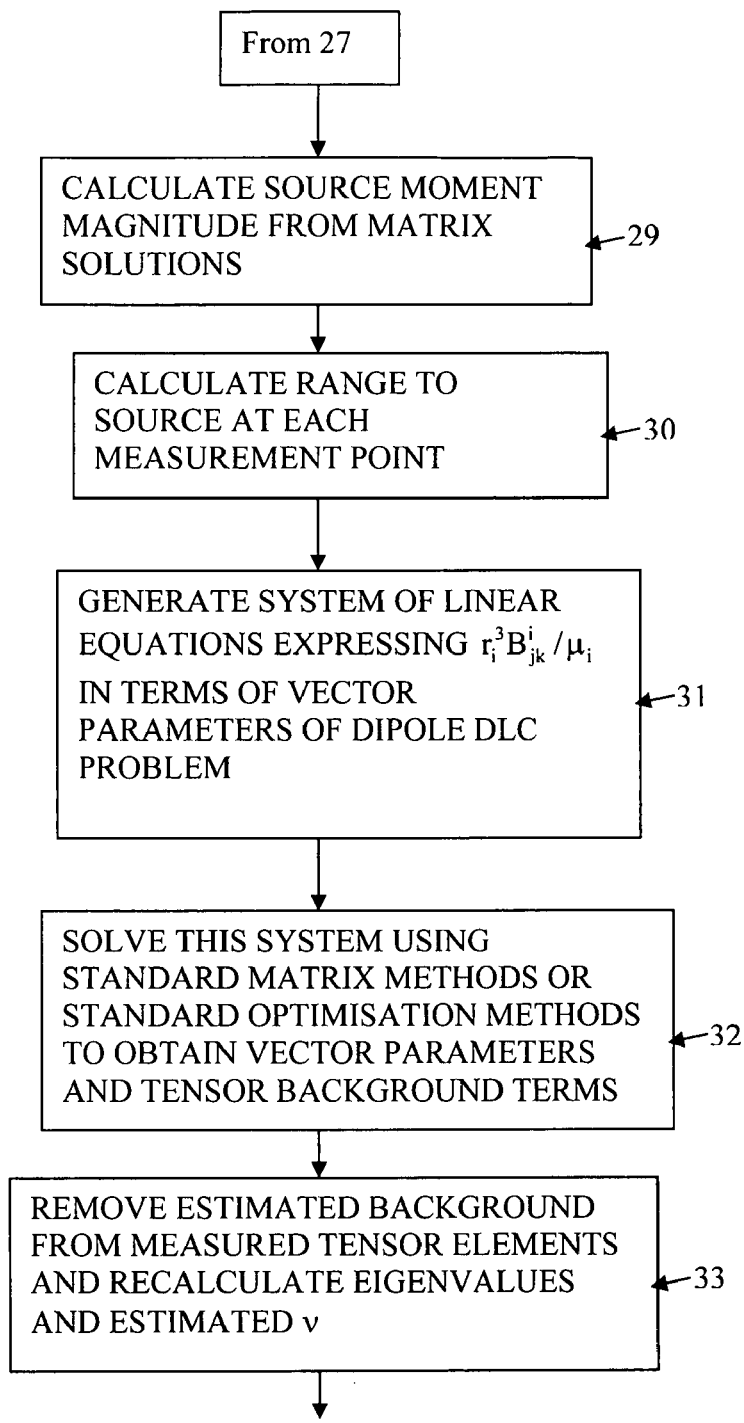

The parameters of interest are directly determined, with the magnitude of the $u_2$ and $u_4$ terms providing an indication of error. The process can be repeated with the estimated interference removed from the original data (step 26 of FIG. 3b). Logic switch 27 of FIG. 3b decides whether the fit of the model to the measured data is acceptable. If not, another data point is included in the analysis (step 28 of FIG. 3b). The background-corrected scaled moment peaks at the point of closest approach, where it is equal to $\sqrt{m/S^2}$. When the modelled v is well fitted by the data, the refined estimate of m is used in subsequent analysis (step 29 of FIG. 3c).

At each measurement point the distance to the dipole is given by (step 30 of FIG. 3c):

$$r_i = \sqrt{\left(\frac{\sqrt{m}}{v_i}\right)},$$

or $$r_i = \sqrt{(x_i - x_0)^2 + S^2}.$$

A number of practical considerations apply in implementing the present invention. Solutions may be numerically unstable if the algorithm is applied to a short, quasilinear segment of data, particularly on the flanks of the profile caused by the anomaly. It is therefore desirable to fit a substantial portion of the anomaly, either by including many data points in the fit or, if this is too demanding computationally, fitting every $n^{th}$ point over a segment, then moving the data window by one point and repeating the inversion. Successive solutions that satisfy reliability criteria can be then averaged, after they have been reduced to a common origin.

Solutions are more robust if the interference term is simplified. For example if the interference is assumed to be a constant base level shift over the fitted segment, the matrix equations simplify to:

$$M = \begin{bmatrix} 1 & x_1 & x_1^2 & v_1 & v_1 x_1 \\ 1 & x_2 & x_2^2 & v_2 & v_2 x_2 \\ \vdots & \vdots & \vdots & \vdots & \vdots \\ 1 & x_n & x_n^2 & v_n & v_n x_n \end{bmatrix}$$

$$V = \begin{bmatrix} v_1 x_1^2 \\ v_2 x_2^2 \\ \vdots \\ v_n x_n^2 \end{bmatrix}.$$

$$u = \begin{bmatrix} \sqrt{m} + a(x_0^2 + S^2) \\ -2 x_0 a \\ a \\ -(x_0^2 + S^2) \\ 2 x_0 \end{bmatrix}.$$

M is an n×5 matrix, u is an 5×1 column vector and v is n×1. For n>5 this matrix equation defines an over-determined system of linear equations in combinations of the unknown parameters. The least-squares best-fit solution to this system of equations can be written formally as:

$$u = \begin{bmatrix} u_1 \\ u_2 \\ u_3 \\ u_4 \\ u_5 \end{bmatrix} = (M^T M)^{-1} M^T v.$$

The unknown parameters of interest are given by:

$x_0 = u_5/2$, $S = \sqrt{(-u_4 - x_0^2)}$, $a = (u_3 - u_2/u_5)/2$, $m = (u_1 + a u_4)^2$.

As the data window is shifted, the background level will change slowly. A linear or quadratic fit to the estimated values of a as a function of x can then be used to subtract the background from the whole data set and a more robust fit to the source parameters obtained from the background-corrected data.

An alternative approach to determining the unknown parameters of the target is to undertake a non-linear least-squares inversion, using well known techniques. In this approach we model measured values of the parameter v, sampled at $x=x_1, x_2, \ldots, x_n$ along a profile by:

$$v = \frac{\sqrt{m}}{(x-x_0)^2 + S^2} + a + bx + cx^2.$$

In this case the optimisation problem is to find estimates of the parameters $x_0$, S, m, a, b, c that minimise the sum of shares of the residuals $\Delta v_i$, which are given by:

$$\Delta v_i = v_i - \left(\frac{\sqrt{m}}{(x_i-x_0)^2 + S^2} + a + bx_i + cx_i^2\right), (i = 1, 2, \ldots, n).$$

The Gauss-Newton algorithm employs a linearised estimate of the changes $\Delta p = (x_0, S, m, a, b, c)^T$ that are needed to reduce the residuals to zero. In matrix form, this yields:

$$\begin{bmatrix} \Delta v_1 \\ \Delta v_2 \\ \vdots \\ \Delta v_n \end{bmatrix} =$$

$$\begin{bmatrix} \left(\frac{\partial v}{\partial \sqrt{m}}\right)_{x_1} & \left(\frac{\partial v}{\partial x_0}\right)_{x_1} & \left(\frac{\partial v}{\partial S}\right)_{x_1} & \left(\frac{\partial v}{\partial a}\right)_{x_1} & \left(\frac{\partial v}{\partial b}\right)_{x_1} & \left(\frac{\partial v}{\partial c}\right)_{x_1} \\ \left(\frac{\partial v}{\partial \sqrt{m}}\right)_{x_2} & \left(\frac{\partial v}{\partial x_0}\right)_{x_2} & \left(\frac{\partial v}{\partial S}\right)_{x_2} & \left(\frac{\partial v}{\partial a}\right)_{x_2} & \left(\frac{\partial v}{\partial b}\right)_{x_2} & \left(\frac{\partial v}{\partial c}\right)_{x_2} \\ \vdots & \vdots & \vdots & \vdots & \vdots & \vdots \\ \left(\frac{\partial v}{\partial \sqrt{m}}\right)_{x_n} & \left(\frac{\partial v}{\partial x_0}\right)_{x_n} & \left(\frac{\partial v}{\partial S}\right)_{x_n} & \left(\frac{\partial v}{\partial a}\right)_{x_n} & \left(\frac{\partial v}{\partial b}\right)_{x_n} & \left(\frac{\partial v}{\partial c}\right)_{x_n} \end{bmatrix} \begin{bmatrix} \Delta\sqrt{m} \\ \Delta x_0 \\ \Delta S \\ \Delta a \\ \Delta b \\ \Delta c \end{bmatrix},$$

$$\therefore \Delta v = \begin{bmatrix} \Delta v_1 \\ \Delta v_2 \\ \vdots \\ \Delta v_n \end{bmatrix} = J \begin{bmatrix} \Delta\sqrt{m} \\ \Delta x_0 \\ \Delta S \\ \Delta a \\ \Delta b \\ \Delta c \end{bmatrix} = J\Delta p,$$

where $$J = \begin{bmatrix} \frac{1}{(x_1-x_0)^2+S^2} & \frac{2(x_1-x_0)\sqrt{m}}{(x_1-x_0)^2+S^2} & \frac{-2S\sqrt{m}}{(x_1-x_0)^2+S^2} & 1 & x_1 & x_1^2 \\ \frac{1}{(x_2-x_0)^2+S^2} & \frac{2(x_2-x_0)\sqrt{m}}{(x_2-x_0)^2+S^2} & \frac{-2S\sqrt{m}}{(x_2-x_0)^2+S^2} & 1 & x_2 & x_2^2 \\ \vdots & \vdots & \vdots & \vdots & \vdots & \vdots \\ \frac{1}{(x_n-x_0)^2+S^2} & \frac{2(x_n-x_0)\sqrt{m}}{(x_n-x_0)^2+S^2} & \frac{-2S\sqrt{m}}{(x_n-x_0)^2+S^2} & 1 & x_n & x_n^2 \end{bmatrix}.$$

A solution for the six parameters requires $n \geq 6$. With $n > 6$ the system of equations is over-determined, with a least-squares solution obtained by solving the normal equations:

$$J^T J \Delta p = J^T \Delta v.$$

The updated set of parameters $p + \Delta p$ is then used to calculate a new set of residuals and the process is repeated until the fit is acceptable.

Reasonable initial guesses for the parameters are the approximate location of the maximum value of v for $x_0$, the approximate half width at half maximum (HWHM) for S, the square of the HWHM value of S, multiplied by $v_{max}$ for $\sqrt{m}$, and zero for a, b, c, which is equivalent to ignoring the background. Alternatively, the average value of v well away from the anomaly peak could be used as the initial estimate of a.

Dividing v by $v_{max}$ and normalising all values of horizontal co-ordinate to S makes all quantities dimensionless and aids numerical stability.

The Levenberg-Marquardt algorithm modifies the inversion by adding a term to the LHS of the normal equations:

$$(J^T J + \lambda I)\Delta p = J^T \Delta v,$$

where $\lambda \geq 0$ is an adjustable damping parameter that controls the rate of convergence and the stability and I is the identity matrix. This algorithm is a compromise between the Gauss-Newton method, which converges rapidly but may require good initial estimates, and the method of steepest descent, which is robust but may converge slowly. Assuming that the Jacobian matrix has been normalised appropriately, so that diagonal elements are of the order unity, a suitable initial choice of the damping parameter might be $\lambda = 10$-$20$, which corresponds to an initial steepest descent approach. After each reduction in the squared residual, $\lambda$ can be reduced by a factor of 10, until no further improvements in the fit occur. For $\lambda \ll 1$, the method reduces essentially to the Gauss-Newton algorithm, ensuring rapid convergence.

At each measurement point the distance to the dipole is given by:

$$r_i = \sqrt{\left(\frac{\sqrt{m}}{v_i}\right)},$$

or $$r_i = \sqrt{(x_i - x_0)^2 + S^2}.$$

where the parameter v in this and all subsequent expressions is assumed to have been corrected for background fields.

Figure 3D:
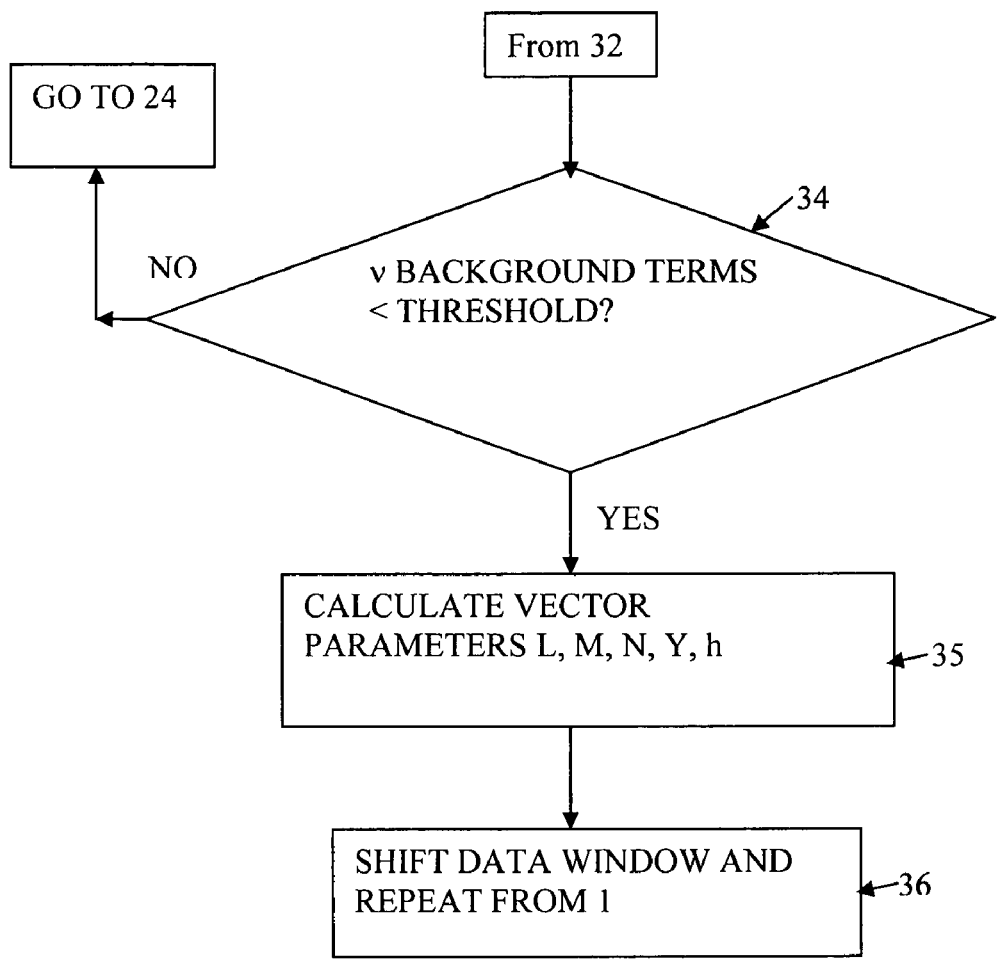

Once the origin of x and slant distance are determined and the background-corrected scaled moment, $\mu_i = 3v_i^2$, and distance to source, $r_i$, at successive points are known, the five independent measured gradient tensor elements can be analysed as described above to estimate the remaining parameters of the dipole: Y, h, L, M, N and the interference terms for each of the gradient tensor elements. In this second embodiment, these parameters are calculated using steps 29-33 of FIG. 3c and steps 34-36 of FIG. 3d, in the same fashion to steps 11-18 of FIG. 2.

The present invention thus recognises that gradient measurements are relatively insensitive to orientation. This is because gradients arise largely from anomalous sources, and the background gradient is low, in contrast to the field vector, which is dominated by the background field arising from the Earth's core. Gradient measurements are therefore most appropriate for mobile sensor applications. Another advantage of gradient measurements is that they obviate the need for base stations through common-mode rejection of time-varying geomagnetic fields during the survey. They also greatly reduce the need for regional corrections, which are required by TMI surveys due to fields arising from sources that are deeper or broader than the features of interest, or to the normal (quasi-) latitudinal intensity variation of the global field. However, it is notable that variable background gradients of geological origin or from neighbouring sources do present problems for conventional methods of dipole location/tracking, and the present invention is designed to minimise these problems by estimating and removing these effects. Gradient measurements also provide significantly higher resolution of closely spaced sources than TMI or vector field measurements.

Gradient measurements also provide valuable additional information, compared to conventional total field measurements, when the field is undersampled. Undersampling is common perpendicular to flight lines in airborne surveys, is usual in ground surveys, and always pertains in down-hole surveys. Although TMI gradients can be useful in the above-mentioned applications, the present invention recognises that full magnetic gradient tensor contains significantly more information. In particular, measurements of the full magnetic gradient tensor can be used to uniquely locate and characterise a compact magnetic source from measurements at only a few nearby locations. Furthermore, rotational invariant quantities, which are independent of sensor orientation, have simple mathematical form and are relatively easy to interpret, and can be calculated from the gradient tensor.

Embodiments of the invention may thus provide improved imaging and mapping of compact source locations and their magnetic moments, even in the presence of instrumental drifts, relatively high levels of noise or substantial interference from deeper and/or broader anomaly sources, while suppressing effects of time-varying magnetic fields, regional geological gradients and errors in orientation of the sensor. In mapping applications, embodiments enabling identification of source location from a single nearby pass further may allow flight line spacing to be doubled, for example, and/or may permit movement of the magnetised body during a time period from one set of measurements to the next to be detected and determined. Moreover, the ability to determine location from a single pass means that flight lines do not need to pass directly over, or on both sides of, the magnetised body, but may suffice if passing only to one side of the magnetised body.

Embodiments of the present invention may thus be applicable to data acquired by a single tensor gradiometer of any type, acquiring data along an approximately linear profile segment. Embodiments of the invention use specific rotational invariants, calculated directly and simply from the eigenvalues of the tensor, which have the virtues of perfect isotropy around the dipole source, eliminating asphericity errors. These invariants are the scaled moment and a quantity proportional to the square root of the scaled moment. Preferred embodiments do not require calculation of eigenvectors or calculation of the tensor with respect to principal axes, thereby reducing computational requirements and avoiding numerical instability of solutions.

Preferred embodiments of the invention are relatively simple mathematically and rely on readily implemented numerical algorithms for extraction of dipole source parameters, and further improve signal-to-noise ratio by incorporating sufficient measurements from a time series to average out effects of individually noisy measurements. Preferred embodiments simplify inversion of the segment of gradient tensor data, to obtain the dipole location and moment vector, by separating the scalar and vector aspects of the inversion. Preferred embodiments further provide for estimating and removing background interference terms, drifts and non-dipole terms, which enables the final solution to be based on an almost pure dipole signature, minimising or avoiding systematic errors.

It will be appreciated by persons skilled in the art that numerous variations and/or modifications may be made to the invention as shown in the specific embodiments without departing from the scope of the invention as broadly described. For example, the case of a stationary sensor and a moving magnetic body may arise in embodiments of the present invention, such as systems for detecting metal in items such as food or laundry on a conveyor belt, security systems at doors or portals, or the like. Where the magnetic body moves past the sensor at an unknown substantially constant speed, a single sensor may yield a solution which is not unique for: (a) range at the point of closest approach; and (b) magnetic moment magnitude. In such cases a unique solution may be obtained by use of additional sensor(s) at a suitable known location nearby, and/or by incorporating additional information regarding the point of closest approach or other constraints. The present embodiments are, therefore, to be considered in all respects as illustrative and not restrictive.

The invention claimed is:

1. A method of locating and characterising a magnetised body, the method comprising:
   during relative movement between a magnetic gradient tensor sensor and the magnetised body, along a profile, obtaining a plurality of magnetic gradient tensor measurements corresponding to points along the profile, at different relative orientations between the sensor and magnetised body; and
   determining at least one characteristic of the magnetised body using a rotational invariant calculated from the eigenvalues of the magnetic gradient tensor measurements.

2. The method of claim 1 wherein the at least one characteristic comprises the range and direction of the magnetised body relative to the sensor and/or the magnitude and orientation of the magnetic moment of the magnetised body.

3. The method of claim 1 further comprising obtaining measurements at each of multiple relative orientations between sensor and body, and eliminating spurious solutions and identifying a single solution for range and direction information and for the dipole moment vector from such measurements.

4. The method of claim 1 further comprising averaging out noise in the individual measurements, to produce more robust and precise estimates of the target parameters.

5. The method of claim 1 wherein the determined characteristics of the magnetised body include an orientation of a magnetic dipole representing the magnetic moment of the magnetised body.

6. The method of claim 1 further comprising a two-step analysis of the gradient tensor, whereby scalar parameters of the source including the magnetic moment magnitude and the distance to the source at each measurement point are estimated from a profile segment of rotational invariants, and these solutions are then used to extract the vector parameters of the source, such as the direction to the source and the orientation of its magnetic moment.

7. The method of claim 6 further comprising iterative improvement of estimates of source parameters, by estimating and removing background interference terms from the measured rotational invariants and tensor elements, then repeating the analysis on the corrected profile data.

8. The method of claim 1 wherein one or more characteristics of the magnetised body are determined by deconvolving the scaled moment of a point dipole representation of the magnetised body or by deconvolving the square root of the scaled moment.

9. The method of claim 1 wherein the plurality of measurements are obtained as the sensor is moved along a substantially linear or piecewise linear path.

10. The method of claim 1 wherein deconvolution of the scaled moment profile of such measurements comprises:
   modelling the scaled moment and background interference terms determined from the measurements;
   obtaining sufficient measurements to obtain an over-determined system of linear equations using the model;
   solving the system of linear equations for unknown parameters of the model and for background gradients of various orders;
   modelling the individual gradient tensor elements and background interference terms, incorporating scalar parameters that have been estimated in the previous steps; and
   solving the resulting system of linear equations for the remaining unknown parameters of the model and for background gradients of various orders.

11. The method of claim 10 wherein the systems of linear equations are solved directly by a least-squares best-fit pseudo inverse solution or by a numerically robust method such as QR decomposition or singular value decomposition.

12. The method of claim 10 wherein the scaled moment of a dipole source is defined as:

$$\mu = \frac{3m}{r^4},$$

where m is the magnitude of the dipole moment (in appropriate units) and r is the distance from the point dipole to the sensor, and wherein in the absence of interference from other sources, the scaled moment is expressed as the following combination of eigenvalues:

$$\mu = \sqrt{-\lambda_2^2 - \lambda_1 \lambda_3},$$

where the eigenvalues of the gradient tensor in descending order are $\lambda_1 \geq \lambda_2 \geq \lambda_3$, and wherein the model of the scaled moment, as calculated from the eigenvalues of the gradient tensor, comprises:

$$\mu_i = \frac{3m}{((x_i - x_0)^2 + S^2)^2} + a + bx_i + cx_i^2,$$

where $x_0$ is the co-ordinate of the point of closest approach along the measurement profile, $S=\sqrt{(Y^2+h^2)}$ is the slant distance from the point of closest approach to the dipole, Y is the horizontal offset of the target dipole from the profile, h is the height of the profile above the target level, a is the base level, and b, c are coefficients of linear and quadratic terms that represent interference from other anomalies.

13. The method of claim 12 wherein the number of measurements obtained n is greater than 11, and an over-determined system of linear equations arises, allowing solution of the system for the unknown parameters.

14. The method of claim 12 wherein an iterative solution is determined by first identifying the point of closest approach $x_0$ and then repeating all calculations with this point being used as origin.

15. The method of claim 12 wherein at each sensor location the range from the sensor to the magnetised body is determined by $$r_i = \left(\frac{3m}{\mu_i}\right)^{1/4},$$

or $$r_i = \sqrt{(x_i - x_0)^2 + S^2},$$

where the scaled moment has been corrected for background fields.

16. The method of claim 10 wherein complete information for source moment and location is derived from the individual magnetic gradient tensor elements.

17. The method of claim 16, further comprising:
   modelling the five independent measured gradient tensor elements in a second model based on known parameters of the model of the scaled moment;
   solving the deconvolution problem of the second model for parameters giving at least one of: interference terms; magnetic moment source relative to the sensor; and sign and magnitude of the lateral displacement of the source from the point of closest approach.

18. The method of claim 8 wherein deconvolution of the square root of (the scaled moment)/3 is undertaken.

19. The method of claim 18 further comprising solving for parameters of a model of the square root of the scaled moment and solving for parameters of a model of the individual components of the gradient tensor, to make the deconvolution problem mathematically equivalent to a Werner deconvolution of the TMI anomaly of a thin sheet.

20. A device for locating and characterising a magnetised body, the device comprising:
   a sensor for obtaining a plurality of magnetic gradient tensor measurements at different relative orientations between the sensor and a magnetised body, during relative movement between the sensor and the magnetised body along a profile; and
   a processor for determining at least one characteristic of the magnetised body using a rotational invariant calculated from the eigenvalues of the magnetic gradient tensor measurements.

* * * * *